United States Patent
Chen et al.

(10) Patent No.: US 11,153,984 B1
(45) Date of Patent: Oct. 19, 2021

(54) ELECTRONIC APPARATUS

(71) Applicants: Inventec (Pudong) Technology Corporation, Shanghai (CN); INVENTEC CORPORATION, Taipei (TW)

(72) Inventors: Chia-Chen Chen, Taipei (TW); Tang-An Liu, Taipei (TW); Chi-Zen Peng, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/005,299

(22) Filed: Aug. 27, 2020

(30) Foreign Application Priority Data

Jun. 10, 2020 (CN) .......................... 202010524276.5

(51) Int. Cl.
*G06F 1/16* (2006.01)
*H05K 5/02* (2006.01)
*H05K 5/00* (2006.01)

(52) U.S. Cl.
CPC ......... *H05K 5/0226* (2013.01); *G06F 1/1681* (2013.01); *H05K 5/0008* (2013.01)

(58) Field of Classification Search
CPC .. G06F 1/1681; H05K 5/0226; H05K 5/0008; E05D 1/06; E05D 5/02; E05D 5/125; E05D 7/1022; E05D 7/1055; E05D 2005/145; E05D 5/14; E05D 2007/0484; F16C 11/04; Y10T 16/525; Y10T 16/548; Y10T 16/558
See application file for complete search history.

(56) References Cited

U.S. PATENT DOCUMENTS 6,695,629 B1 * 2/2004 Mayer .................... H05K 7/142
361/752
6,810,563 B1 * 11/2004 Domenig ................ E05D 5/065
16/236
(Continued)

FOREIGN PATENT DOCUMENTS

CN 103711395 A * 4/2014 ........... E05D 5/0276
EP 2239404 A2 * 10/2010 ............. E05D 15/46
(Continued)

*Primary Examiner* — Abhishek M Rathod
*Assistant Examiner* — Keith DePew
(74) *Attorney, Agent, or Firm* — CKC & Partners Co., LLC

(57) ABSTRACT

An electronic apparatus includes a first housing, a second housing, a positioning structure, a hinge structure and a positioning piece. The positioning structure includes a plate, a pole and a first snapping portion. The pole and the first snapping portion connect the plate which connects the second housing. The hinge structure includes a first connecting portion and a second connecting portion. The first connecting portion connects the first housing. The second connecting portion pivotally connects the first connecting portion. The second connecting portion includes a main body, a second snapping portion and a hole. The second snapping portion connects the main body and snaps with the first snapping portion. The hole locates at the main body for the pole to penetrate through. The positioning piece locates in the hole and abuts against the main body. The positioning piece connects the pole.

10 Claims, 5 Drawing Sheets

(56) References Cited

U.S. PATENT DOCUMENTS

| | | | |
|---|---|---|---|
| 6,964,581 B2* | 11/2005 | Chen | H05K 7/1417 |
| | | | 174/138 D |
| 2010/0083465 A1* | 4/2010 | Jones | E05D 7/04 |
| | | | 16/221 |
| 2010/0281653 A1* | 11/2010 | Lin | G06F 1/1616 |
| | | | 16/285 |
| 2011/0084892 A1* | 4/2011 | Han | E05D 11/04 |
| | | | 345/1.3 |
| 2013/0305488 A1* | 11/2013 | Dodge | G06Q 30/0277 |
| | | | 16/245 |
| 2014/0143983 A1* | 5/2014 | Yu | G06F 1/1681 |
| | | | 16/384 |
| 2016/0040463 A1* | 2/2016 | Gramstad | E05D 5/128 |
| | | | 16/382 |
| 2016/0085271 A1* | 3/2016 | Morrison | G06F 1/1652 |
| | | | 361/679.27 |
| 2016/0153222 A1* | 6/2016 | Hu | G06F 1/1681 |
| | | | 361/679.55 |
| 2017/0356225 A1* | 12/2017 | Maatta | H04M 1/022 |
| 2018/0052497 A1* | 2/2018 | Maatta | E05D 3/12 |
| 2018/0058120 A1* | 3/2018 | Hamel | G06F 1/1681 |
| 2018/0283446 A1* | 10/2018 | Todd | E05D 1/02 |

FOREIGN PATENT DOCUMENTS

| | | |
|---|---|---|
| TW | M248218 U | 10/2004 |
| TW | M407946 U | 7/2011 |

* cited by examiner

ELECTRONIC APPARATUS

RELATED APPLICATIONS

This application claims priority to Chinese Application Serial Number 202010524276.5 filed Jun. 10, 2020, which is herein incorporated by reference.

BACKGROUND

Technical Field

The present disclosure relates to electronic apparatus.

Description of Related Art

With regard to the increase of the living quality of people, the demand of people for electronic products has also been increasing. Correspondingly, in order to fulfill the increasing demand of the consumers, the manufacturers have been working hard to improve the electronic products.

Apart from improving the performance and efficacy of electronic products, the way to make the appearance of electronic products to become slimmer and thinner is undoubtedly an important issue that is highly concerned by the industry.

SUMMARY

A technical aspect of the present disclosure is to provide an electronic apparatus, which can achieve the effect of having a slim and thin appearance.

According to an embodiment of the present disclosure, an electronic apparatus includes a first housing, a second housing, a positioning structure, a hinge structure and a positioning piece. The positioning structure includes a base plate, a positioning pole and at least one snapping portion. The positioning pole and the first snapping portion connect with the base plate. The base plate connects with the second housing. The hinge structure includes a first connecting portion and a second connecting portion. The first connecting portion connects with the first housing. The second connecting portion pivotally connects with the first connecting portion. The second connecting portion includes a main body, at least one second snapping portion and a positioning hole. The second snapping portion connects with the main body and is configured to snap with the first snapping portion. The positioning hole is located at the main body and is configured to allow the positioning pole to pass through. The positioning piece is configured to be at least partially located in the positioning hole and at least partially abut against the main body. The positioning piece is further configured to connect with the positioning pole. When the positioning piece is connected with the positioning pole, the second snapping portion snaps with the first snapping portion.

In one or more embodiments of the present disclosure, the main body includes a first inner wall and two second inner walls. The first inner wall surrounds about a first axis to define a circular hole. The circular hole has a diameter. The second inner walls are parallel and opposite with each other and define a long hole. The long hole and the circular hole communicate with each other to define together the positioning hole. The second inner walls have a distance therebetween. The distance is shorter than the diameter. The first inner wall is farther away from the second snapping portion relative to the second inner walls.

In one or more embodiments of the present disclosure, the first inner wall is inclined relative to the first axis.

In one or more embodiments of the present disclosure, the positioning piece includes a positioning portion and a force exerting portion. The positioning portion has a first outer wall. The first outer wall surrounds about a second axis to form a circle. The first outer wall is inclined relative to the second axis and is substantially parallel with the first inner wall. The first outer wall is configured to at least partially abut against the first inner wall. The force exerting portion connects with the positioning portion along the second axis. The force exerting portion has a second outer wall. The second outer wall surrounds about the second axis to form a polygon.

In one or more embodiments of the present disclosure, the positioning pole has a first height. The positioning piece has a second height along the second axis. The first height is substantially equal to the second height.

In one or more embodiments of the present disclosure, the base plate has a through hole. The through hole is divided into a first subsidiary through hole and a second subsidiary through hole. The first subsidiary through hole and the second subsidiary through hole communicate with each other. The second subsidiary through hole is farther away from the positioning pole relative to the first subsidiary through hole. The first snapping portion at least partially covers the second subsidiary through hole. The second snapping portion is configured to slide from the first subsidiary through hole to the second subsidiary through hole and to mutually snap with the first snapping portion.

In one or more embodiments of the present disclosure, a first total height of the main body and the second snapping portion is substantially equal to a second total height of the base plate and the positioning pole.

In one or more embodiments of the present disclosure, the positioning pole, the first snapping portion and the base plate are of an integrally formed structure.

In one or more embodiments of the present disclosure, the positioning pole has an outer screw. The positioning piece has an inner screw. The outer screw and the inner screw couple with each other.

In one or more embodiments of the present disclosure, a quantity of the second snapping portion and a quantity of the first snapping portion are respectively plural.

When compared with the prior art, the above-mentioned embodiments of the present disclosure have at least the following advantages:

(1) Since the first height of the positioning pole is substantially equal to the second height of the positioning piece, after the relative position of the second connecting portion and the positioning structure is fixed as the positioning piece is connected to the positioning pole, the positioning piece will not be higher than the positioning pole in the direction along which the positioning pole extends. Thus, the saving of space is facilitated, and the electronic apparatus can achieve the effect of having a slim and thin appearance.

(2) Since the first total height of the main body and the second snapping portion is substantially equal to the second total height of the base plate and the positioning pole, after the relative position of the second connecting portion and the positioning structure is fixed as the positioning piece is connected to the positioning pole, the second connecting portion will not be higher than the positioning pole in the direction along which the positioning pole extends. Thus, the saving of space is facilitated, and the electronic apparatus can achieve the effect of having a slim and thin appearance.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
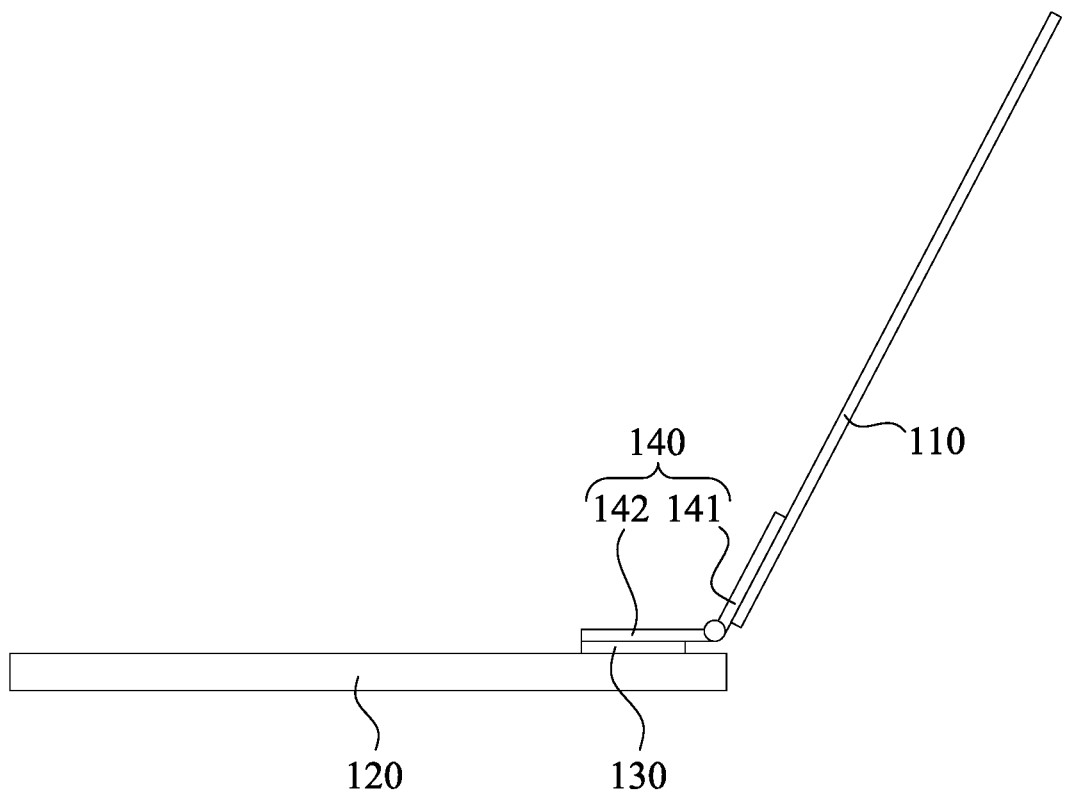
FIG. 1 is a side view of an electronic apparatus according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a side view of an electronic apparatus 100 according to an embodiment of the present disclosure. The electronic apparatus 100 as shown in FIG. 1 is only a simplified presentation. Please refer to FIGS. 2-5 for the detailed structure of the electronic apparatus 100. In this embodiment, as shown in FIG. 1, an electronic apparatus 100 includes a first housing 110, a second housing 120, a positioning structure 130 and a hinge structure 140. The positioning structure 130 is connected with the second housing 120. The hinge structure 140 is connected between the first housing 110 and the positioning structure 130, such that the first housing 110 is able to rotate relative to the second housing 120.

Figure 2:
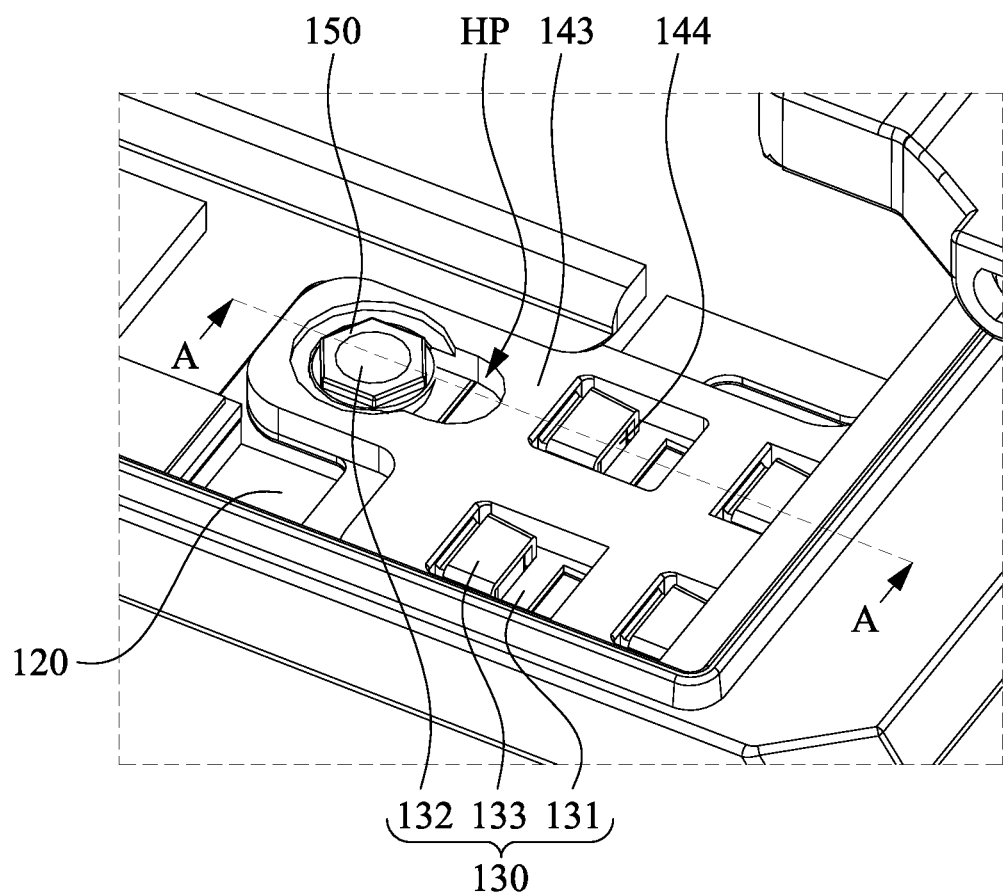
FIG. 2 is a partially enlarged view of the positioning structure, the second connecting portion and the positioning piece of FIG. 1.
Figure 3:
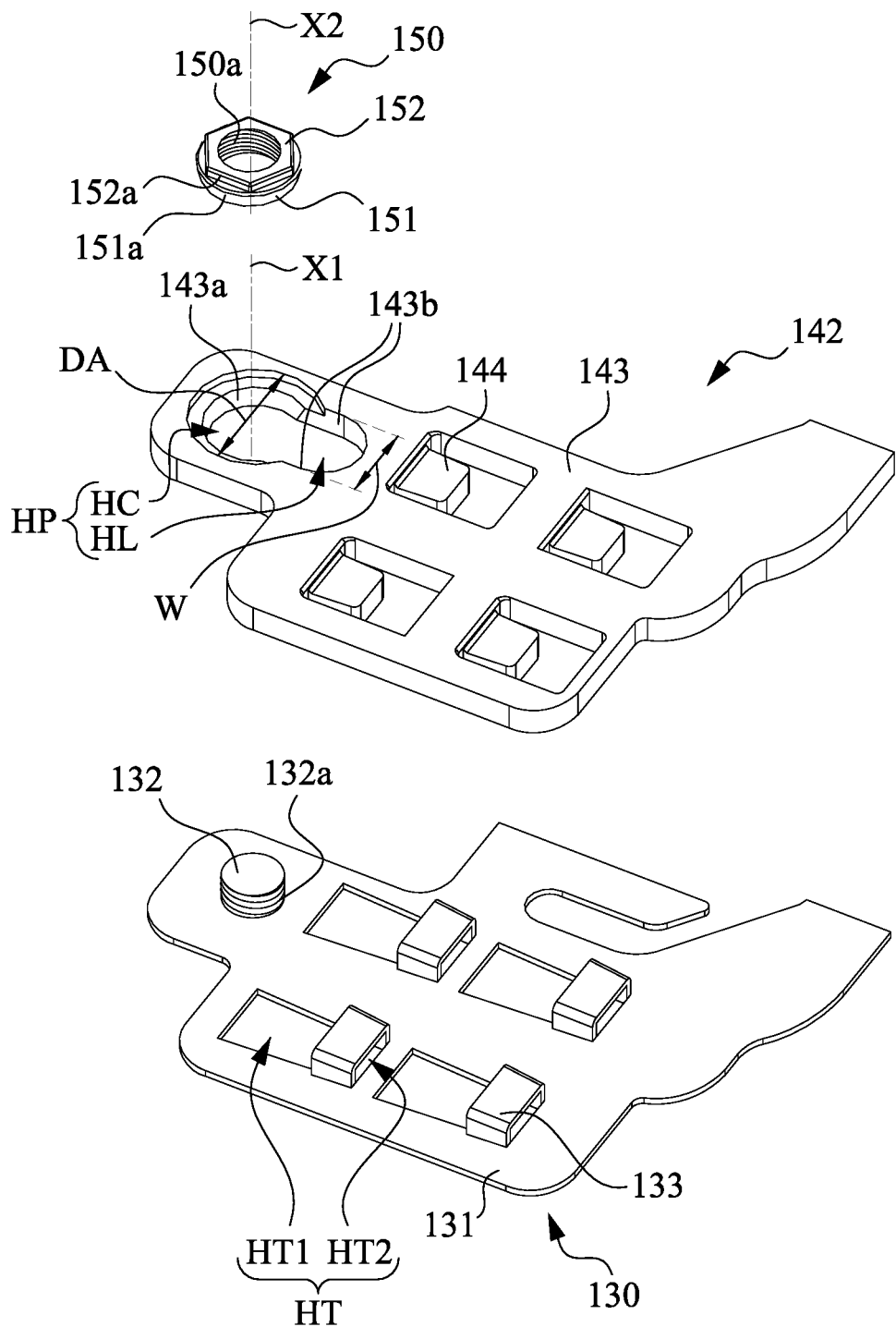
FIG. 3 is an exploded view of the positioning structure, the second connecting portion and the positioning piece of FIG. 1.

Reference is made to FIGS. 2-3. FIG. 2 is a partially enlarged view of the positioning structure 130, the second connecting portion 142 and the positioning piece 150 of FIG. 1. FIG. 3 is an exploded view of the positioning structure 130, the second connecting portion 142 and the positioning piece 150 of FIG. 1. The positioning piece 150 is blocked and thus not shown in FIG. 1. To be specific, as shown in FIGS. 2-3, the positioning structure 130 includes a base plate 131, a positioning pole 132 and at least one snapping portion 133. The positioning pole 132 and the first snapping portion 133 are connected with the base plate 131. The base plate 131 is connected with the second housing 120. In practical applications, the positioning pole 132, the first snapping portion 133 and the base plate 131 are of an integrally formed structure, and the material may include high strength low carbon steel. However, this does not intend to limit the present disclosure. Moreover, the hinge structure 140 includes a first connecting portion 141 (please refer to FIG. 1) and a second connecting portion 142. The first connecting portion 141 is connected with the first housing 110 (please refer to FIG. 1). The second connecting portion 141 is pivotally connected with the first connecting portion 141. Thus, the first connecting portion 141 is able to rotate relative to the second connecting portion 142. This means, the first housing 110 is able to rotate relative to the second housing 120. The second connecting portion 142 includes a main body 143, at least one second snapping portion 144 and a positioning hole HP. The second snapping portion 144 is connected with the main body 143 and is configured to snap with the first snapping portion 133. The positioning hole HP is located at the main body 143 and is configured to allow the positioning pole 132 to pass through. Furthermore, the electronic apparatus 100 further includes a positioning piece 150. The positioning piece 150 is configured to be at least partially located in the positioning hole HP and at least partially abut against the main body 143. The positioning piece 150 is further configured to connect with the positioning pole 132. When the positioning piece 150 is connected with the positioning pole 132, the second snapping portion 144 snaps with the first snapping portion 133, and the relative position of the second connecting portion 142 of the hinge structure 140 and the positioning structure 130 can be fixed. In practical applications, as shown in FIGS. 2-3, a quantity of the second snapping portion 144 of the second connecting portion 142 and a quantity of the first snapping portion 133 of the positioning structure 130 are respectively plural. However, this does not intend to limit the present disclosure.

To be more specific, as shown in FIG. 3, the main body 143 of the second connecting portion 142 includes a first inner wall 143a and two second inner walls 143b. The first inner wall 143a surrounds about a first axis X1 to define a circular hole HC. The circular hole HC has a diameter DA. The second inner walls 143b are parallel and opposite with each other and define a long hole HL. The long hole HL and the circular hole HC are communicated with each other to define together the positioning hole HP. The second inner walls 143b have a distance W therebetween. The distance W of the long hole HL is shorter than the diameter DA of the circular hole HC. The first inner wall 143a is farther away from the second snapping portion 144 relative to the second inner walls 143b. It is worth to note that, in this embodiment, the first inner wall 143a of the main body 143 is inclined relative to the first axis X1.

Correspondingly, as shown in FIG. 3, the base plate 131 of the positioning structure 130 has a through hole HT. The through hole HT is divided into a first subsidiary through hole HT1 and a second subsidiary through hole HT2. The first subsidiary through hole HT1 and the second subsidiary through hole HT2 are communicated with each other. The second subsidiary through hole HT2 is farther away from the positioning pole 132 relative to the first subsidiary through hole HT1. The first snapping portion 133 at least partially covers the second subsidiary through hole HT2. The second snapping portion 144 of the second connecting portion 142 is configured to slide from the first subsidiary through hole HT1 to the second subsidiary through hole HT2, and to mutually snap with the first snapping portion 133 of the positioning structure 130.

In addition, as shown in FIG. 3, the positioning piece 150 includes a positioning portion 151 and a force exerting portion 152. The positioning portion 151 has a first outer wall 151a. The first outer wall 151a surrounds about a second axis X2 to form a circle. The first outer wall 151a is inclined relative to the second axis X2 and is substantially parallel with the first inner wall 143a. When the positioning piece 150 is connected with the positioning pole 132 of the positioning structure 130, the first outer wall 151a of the positioning portion 151 at least partially abuts against the first inner wall 143a of the main body 143, such that under the condition that the positioning piece 150 is connected with the positioning pole 132, the relative position of the second connecting portion 142 of the hinge structure 140 and the positioning structure 130 can be fixed. Moreover, the force exerting portion 152 is connected with the positioning portion 151 along the second axis X2. The force exerting portion 152 has a second outer wall 152a. The second outer wall 152a surrounds about the second axis X2 to form a polygon, such that a user can use a tool to connect the positioning piece 150 to the positioning pole 132 of the positioning structure 130. In practical applications, the positioning pole 132 has an outer screw 132a. The positioning piece 150 has an inner screw 150a. The outer screw 132a of the positioning pole 132 and the inner screw 150a of the positioning piece 150 couple with each other. In addition, for example, the material of the positioning piece 150 can include copper. However, this does not intend to limit the present disclosure.

Figure 4:
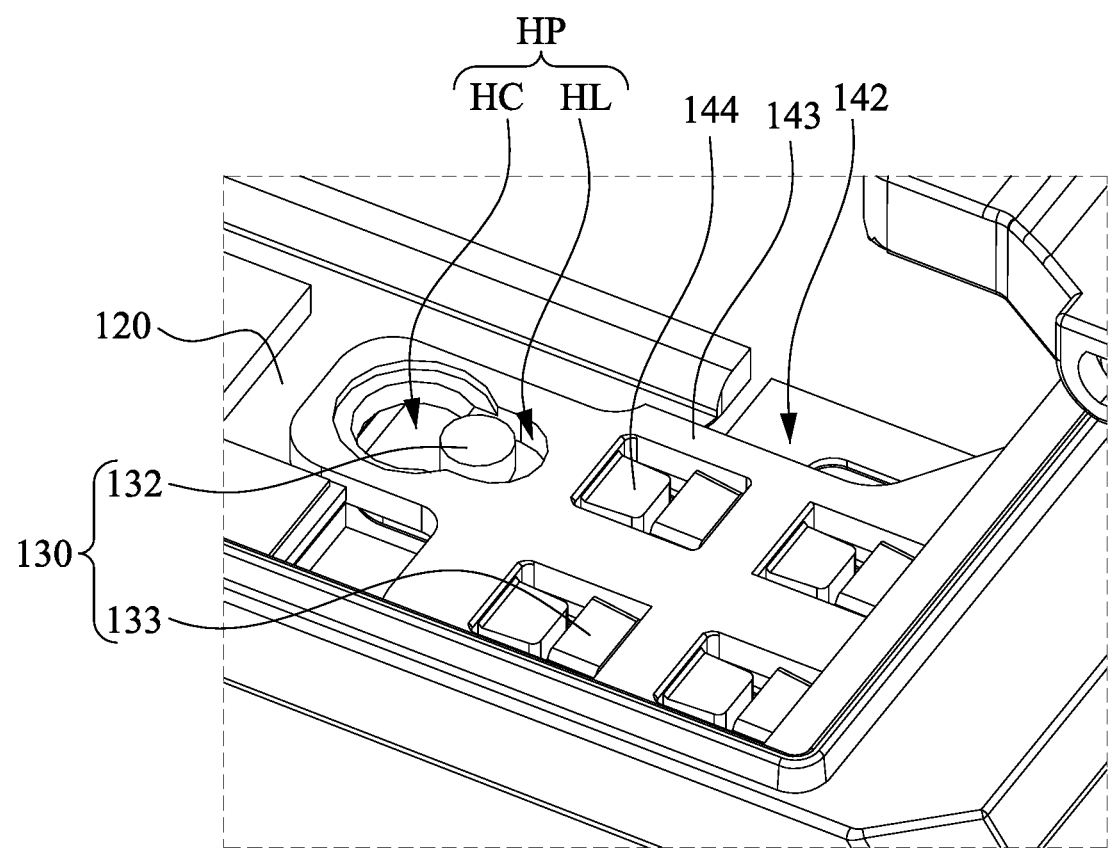
FIG. 4 is a partially enlarged view of the positioning structure and the second connecting portion of FIG. 2, in which the positioning piece is not yet connected to the positioning pole.

Reference is made to FIG. 4. FIG. 4 is a partially enlarged view of the positioning structure 130 and the second connecting portion 142 of FIG. 2, in which the positioning piece 150 is not yet connected to the positioning pole 132. In the process that the second connecting portion 142 of the hinge structure 140 is fixed to the positioning structure 130, as shown in FIG. 4, the user first makes the positioning pole 132 of the positioning structure 130 to penetrate through the long hole HL of the second connecting portion 142, and makes the second snapping portion 144 of the second connecting portion 142 to accommodate in the first subsidiary through hole HT1 (please refer to FIG. 3) of the positioning structure 130. Afterwards, the second connecting portion 142 is slid relative to the positioning structure 130, such that the positioning pole 132 of the positioning structure 130 slides to the circular hole HC of the second connecting portion 142, and the second snapping portion 144 of the second connecting portion 142 slides to the second subsidiary through hole HT2 (please refer to FIG. 3) of the positioning structure 130. As mentioned above, since the first snapping portion 133 of the positioning structure 130 at least partially covers the second subsidiary through hole HT2, after the second snapping portion 144 of the second connecting portion 142 is slid to the second subsidiary through hole HT2 of the positioning structure 130, the first snapping portion 133 of the positioning structure 130 and the second snapping portion 144 of the second connecting portion 142 are snapped and fixed with each other. At this point, the user uses the positioning piece 150 to connect with the positioning pole 132 of the positioning structure 130. Since the first outer wall 151a of the positioning portion 151 at least partially abuts against the first inner wall 143a of the main body 143, the relative position of the second connecting portion 142 of the hinge structure 140 and the positioning structure 130 can be fixed, as shown in FIG. 2.

Figure 5:
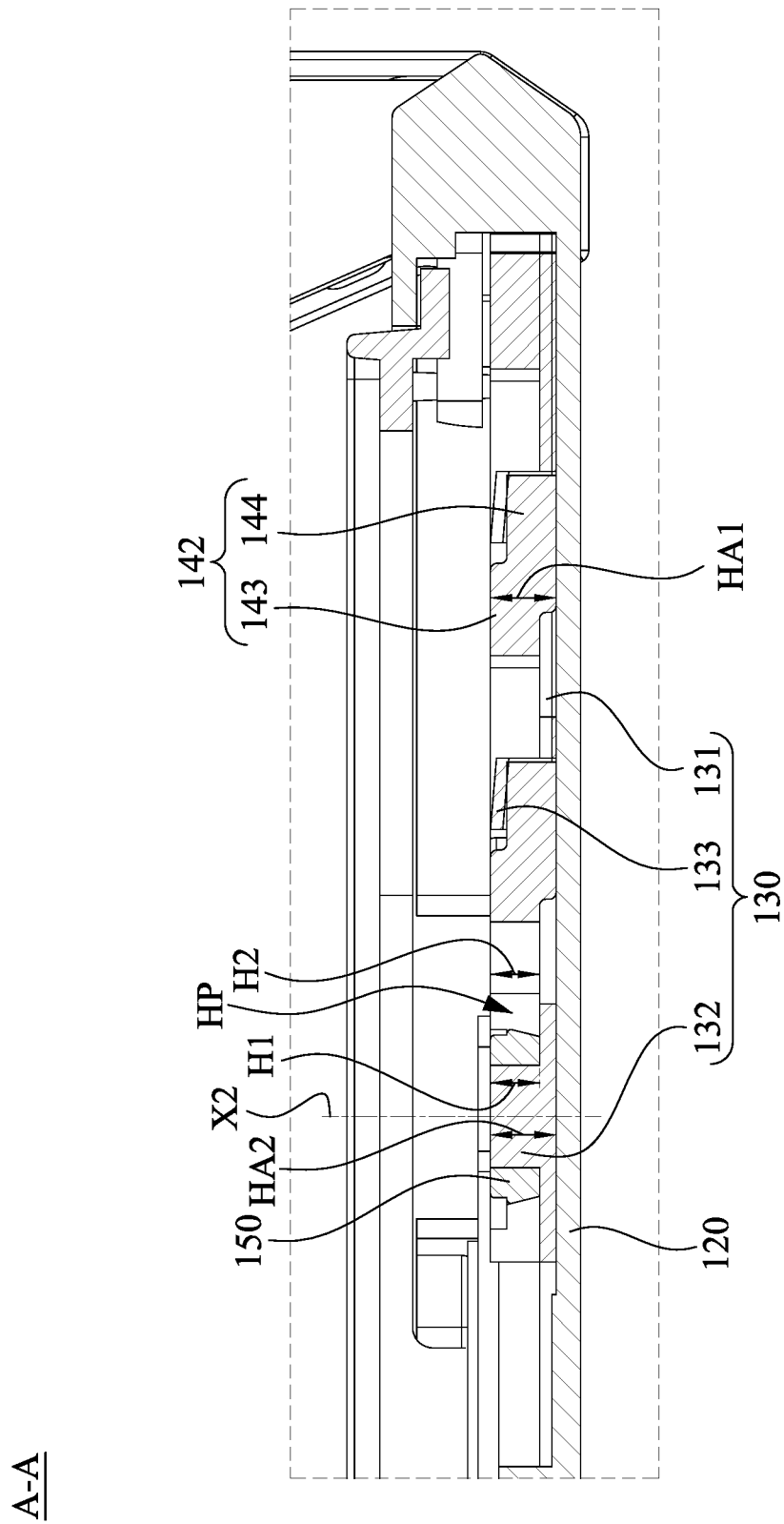
FIG. 5 is a sectional view along a section line A-A of FIG. 2.

Reference is made to FIG. 5. FIG. 5 is a sectional view along a section line A-A of FIG. 2. In this embodiment, as shown in FIG. 5, the positioning pole 132 has a first height H1. The positioning piece 150 has a second height H2 along the second axis X2. The first height H1 of the positioning pole 132 is substantially equal to the second height H2 of the positioning piece 150. In this way, after the relative position of the second connecting portion 142 and the positioning structure 130 is fixed as the positioning piece 150 is connected to the positioning pole 132, the positioning piece 150 will not be higher than the positioning pole 132 in the direction along which the positioning pole 132 extends. Thus, the saving of space is facilitated, and the electronic apparatus 100 can achieve the effect of having a slim and thin appearance.

In additional, as shown in FIG. 5, a first total height HA1 of the main body 143 and the second snapping portion 144 is substantially equal to a second total height HA2 of the base plate 131 and the positioning pole 132. In this way, after the relative position of the second connecting portion 142 and the positioning structure 130 is fixed as the positioning piece 150 is connected to the positioning pole 132, the second connecting portion 142 will not be higher than the positioning pole 132 in the direction along which the positioning pole 132 extends. Thus, the saving of space is facilitated, and the electronic apparatus 100 can achieve the effect of having a slim and thin appearance.

In conclusion, when compared with the prior art, the aforementioned embodiments of the present disclosure have at least the following advantages:

(1) Since the first height of the positioning pole is substantially equal to the second height of the positioning piece, after the relative position of the second connecting portion and the positioning structure is fixed as the positioning piece is connected to the positioning pole, the positioning piece will not be higher than the positioning pole in the direction along which the positioning pole extends. Thus, the saving of space is facilitated, and the electronic apparatus can achieve the effect of having a slim and thin appearance.

(2) Since the first total height of the main body and the second snapping portion is substantially equal to the second total height of the base plate and the positioning pole, after the relative position of the second connecting portion and the positioning structure is fixed as the positioning piece is connected to the positioning pole, the second connecting portion will not be higher than the positioning pole in the direction along which the positioning pole extends. Thus, the saving of space is facilitated, and the electronic apparatus can achieve the effect of having a slim and thin appearance.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:
1. An electronic apparatus, comprising:
a first housing;
a second housing;

a positioning structure comprising a base plate, a positioning pole and at least one snapping portion, the positioning pole and the first snapping portion connecting with the base plate, the base plate connecting with the second housing;

a hinge structure comprising:
  a first connecting portion connecting with the first housing; and
  a second connecting portion pivotally connected with the first connecting portion, the second connecting portion comprising a main body, at least one second snapping portion and a positioning hole, the second snapping portion connecting with the main body and being configured to snap with the first snapping portion, the positioning hole being located at the main body and configured to allow the positioning pole to pass through; and a positioning piece configured to be at least partially located in the positioning hole and at least partially abut against the main body, the positioning piece being further configured to connect with the positioning pole, wherein when the positioning piece is connected with the positioning pole, the second snapping portion snaps with the first snapping portion.

2. The electronic apparatus of claim 1, wherein the main body comprises:
  a first inner wall surrounding about a first axis to define a circular hole having a diameter; and
  two second inner walls parallel and opposite with each other and defining a long hole, the long hole and the circular hole communicate with each other to define together the positioning hole, the second inner walls have a distance therebetween, the distance is shorter than the diameter, the first inner wall is farther away from the second snapping portion relative to the second inner walls.

3. The electronic apparatus of claim 2, wherein the first inner wall is inclined relative to the first axis.

4. The electronic apparatus of claim 3, wherein the positioning piece comprises:

a positioning portion having a first outer wall, the first outer wall surrounds about a second axis to form a circle, the first outer wall is inclined relative to the second axis and is substantially parallel with the first inner wall, the first outer wall is configured to at least partially abut against the first inner wall; and a force exerting portion connected with the positioning portion along the second axis, the force exerting portion has a second outer wall, the second outer wall surrounds about the second axis to form a polygon.

5. The electronic apparatus of claim 4, wherein the positioning pole has a first height, the positioning piece has a second height along the second axis, the first height is substantially equal to the second height.

6. The electronic apparatus of claim 2, wherein the base plate has a through hole divided into a first subsidiary through hole and a second subsidiary through hole communicating with each other, the second subsidiary through hole is farther away from the positioning pole relative to the first subsidiary through hole, the first snapping portion at least partially covers the second subsidiary through hole, the second snapping portion is configured to slide from the first subsidiary through hole to the second subsidiary through hole and to mutually snap with the first snapping portion.

7. The electronic apparatus of claim 1, wherein a first total height of the main body and the second snapping portion is substantially equal to a second total height of the base plate and the positioning pole.

8. The electronic apparatus of claim 1, wherein the positioning pole, the first snapping portion and the base plate are of an integrally formed structure.

9. The electronic apparatus of claim 1, wherein the positioning pole has an outer screw, the positioning piece has an inner screw, the outer screw and the inner screw couple with each other.

10. The electronic apparatus of claim 1, wherein a quantity of the second snapping portion and a quantity of the first snapping portion are respectively plural.

* * * * *